United States Patent
Kaino et al.

(10) Patent No.: US 6,750,537 B2
(45) Date of Patent: Jun. 15, 2004

(54) SUBSTRATE STRUCTURE

(75) Inventors: Hideaki Kaino, Kobe (JP); Hiromichi Watanabe, Kobe (JP); Shinichi Sugiura, Kobe (JP); Shuji Kimura, Kobe (JP); Shigeru Mori, Kobe (JP)

(73) Assignee: Fujitsu Ten Limited, Kobe (JP)

( * ) Notice: Subject to any disclaimer, the term of this patent is extended or adjusted under 35 U.S.C. 154(b) by 0 days.

(21) Appl. No.: 09/993,561

(22) Filed: Nov. 27, 2001

(65) Prior Publication Data

US 2002/0063325 A1 May 30, 2002

(30) Foreign Application Priority Data

Nov. 27, 2000 (JP) .......................................... 2000-358903

(51) Int. Cl.⁷ .............................................. H01L 23/04
(52) U.S. Cl. ....................................... 257/698; 257/700
(58) Field of Search ................................ 257/777, 686, 257/691, 698, 700; 174/255

(56) References Cited

U.S. PATENT DOCUMENTS

| | | | | |
|---|---|---|---|---|
| 4,967,314 A | | 10/1990 | Higgins, III | 361/414 |
| 5,277,787 A | | 1/1994 | Otani et al. | 205/125 |
| 5,371,403 A | * | 12/1994 | Huang et al. | |
| 5,509,200 A | | 4/1996 | Frankeny et al. | 29/852 |
| 5,534,727 A | * | 7/1996 | Inoue | |
| 5,672,911 A | * | 9/1997 | Patil et al. | |
| 5,708,296 A | * | 1/1998 | Bhansali | |
| 5,847,936 A | * | 12/1998 | Forehound et al. | |
| 5,898,217 A | * | 4/1999 | Johnston | |
| 5,929,510 A | * | 7/1999 | Gelkler et al. | |
| 6,008,534 A | * | 12/1999 | Fulcher | |
| 6,137,161 A | * | 10/2000 | Gilliland et al. | |
| 6,137,168 A | * | 10/2000 | Kirkman | |
| 6,187,652 B1 | * | 2/2001 | Chou et al. | |
| 6,239,485 B1 | * | 5/2001 | Peter et al. | |
| 6,365,843 B1 | * | 4/2002 | Shirai et al. | |
| 6,384,343 B1 | * | 5/2002 | Furusawa | |
| 6,388,207 B1 | * | 5/2002 | Figueroa et al. | |
| 6,392,898 B1 | * | 5/2002 | Asai et al. | |
| 6,411,519 B2 | * | 6/2002 | Asai et al. | |
| 6,413,620 B1 | * | 7/2002 | Kimura et al. | |
| 6,538,209 B1 | * | 3/2003 | Ouchi et al. | |

FOREIGN PATENT DOCUMENTS

| | | |
|---|---|---|
| CN | 1051670 C | 4/2000 |
| DE | 3639443 A1 | 5/1988 |
| DE | 19642929 A1 | 7/1997 |
| GB | 2 202 094 A | 9/1988 |
| GB | 2 247 113 A | 2/1992 |
| JP | A 8-116174 | 5/1996 |
| JP | A 10-284838 | 10/1998 |
| JP | A 11-66951 | 3/1999 |

OTHER PUBLICATIONS

IBM Technical Disclosure Bulletin, "Improved Printed Circuit Board Construction", vol. 32, No. 9A, Feb. 1990.
European Search Report.
CN Office Action.

* cited by examiner

Primary Examiner—Sheila V. Clark
(74) Attorney, Agent, or Firm—Oliff & Berridge, PLC

(57) ABSTRACT

A substrate 10 includes multiple layers mounted with a mounted part 20 at its surface. A part pad 40 is provided to the substrate 10 to correspond to an electrode of the mounted part 20. A circuit pattern is provided at a layer at an inner portion of the substrate and an electrically conductive portion 60 for electrically connecting the part pad 40 and the circuit pattern right under the part pad 40.

10 Claims, 2 Drawing Sheets

SUBSTRATE STRUCTURE

BACKGROUND OF THE INVENTION

1. Field of the Invention

The present invention relates to a substrate structure made mountable under a high temperature environment. For example, the invention relates to a substrate structure enabling to be mounted at inside of a housing of a transmission in a vehicle.

2. Description of the Related Art

A description will be given of a technology related to the invention in reference to the drawings as follows.

FIG. 3 is a view showing a conventional substrate structure 100.

As shown by FIG. 3, the substrate structure 100 generally used conventionally comprises a pattern 140 forming a circuit. The pattern 140 is formed by an etching process or the like on a surface of a substrate 110. The substrate 110 is made of a glass epoxy material or the like and formed in multiple layers. A mounted part 120 is mounted via a solder 150 in accordance with the pattern 140. A mounting method for mounting the mounted part 120 is provided, in which solder paste is coated on a portion on the pattern 140 to which the mounted part 120 is intended to mount. Then, the mounted part 120 is mounted thereon, and the substrate 110 is subjected a high temperature environment of a reflow furnace or the like to thereby solidify the solder paste, or the like.

Further, when the mounted parts 120 are mounted on both faces of the substrate 110, a through hole 130 penetrating the substrate 110 from its upper face to its lower face, is provided at the substrate 110. Then, an electrically conductive portion 160 is formed by adhering copper onto a surface of an inner portion of the through hole 130 to thereby conduct the patterns 140 provided at the upper face and the lower face of the substrate 110.

However, the above-described substrate structure is formed persistently on the premise that the substrate structure is mounted under a normal environment. For example, the substrate structure is generally formed even when the substrate structure is subjected to thermal cycle of 3000 cycles under surrounding temperature of −30° C. through 80° C., or when subjected under an environment at surrounded temperature of 105° C. for 1000 hours.

Accordingly, when the substrate structure is mounted under an environment deviated from a range of such an environment set as described above, for example, mounted under an environment in which surrounding temperature exceeds the set environment as in a housing of a transmission in a vehicle (surrounding temperature is about 120° C.), the following problem would arise.

According to the conventional substrate structure, pattern arrangement on the surface of the substrate is complicated. Therefore, there is a possibility of generation of short circuit in the circuit due to dew condensation or the like. A resist film is provided to cover the patter nor the solder in order to prevent the possibility. However, such a resist film does not withstand under the above-described high temperature environment, and therefore, break is caused. Further, there poses a problem that when break is caused in the resist film, break is caused also in the pattern and the solder covered by the resist film.

Further, linear expansion coefficients by heat of the substrate formed by the glass epoxy material are as much as 14 ppm in the horizontal direction (longitudinal direction of substrate) and 50 ppm in the vertical direction (thickness direction of substrate). Therefore, when a bare chip is mounted on the surface of the substrate, there poses a problem that break is caused at a connected portion between an electrode of the bare chip and the substrate by thermal stress in the horizontal direction. Further, when the through hole is provided in the substrate, break is caused at an electrically conductive portion on the surface of the inner portion of the through hole by thermal stress in the vertical direction.

Further, high temperature resistance of the glass epoxy material per se falls in a range of 120 through 130° C. and accordingly, there poses a problem that the substrate per se is softened under a high temperature environment at temperatures equal to or higher than 120° C.

Further, with regard to a substrate structure withstanding even under such a high temperature environment, conventionally, there has been conceived a method of forming a substrate not by a glass epoxy material but by a ceramic material excellent in high temperature resistance against heat and having a low linear expansion coefficient. According to the method, the linear expansion coefficient of the substrate per se is low. A pattern formed on the surface of the substrate can be formed by a sintering process. Accordingly, the problem is not posed in the case of the above-described glass epoxy material, and the substrate can be mounted even under the high temperature environment.

However, according to the substrate structure using the ceramic material, in comparison with the substrate structure using the normal glass epoxy material, there poses a problem that the cost is increased significantly.

SUMMARY OF THE INVENTION

The invention has been made to resolve the above-described problems. It is an object thereof to provide a substrate structure capable of being mounted under a high temperature environment at low cost.

According to the present invention, there is provided a substrate comprising:

a first substrate;

a second substrate disposed on the first substrate, the second substrate having a first circuit pattern;

a third substrate disposed on the second substrate, the third substrate mounting thereon a part having an electrode;

a part pad provided on the third substrate to correspond to the electrode of the part; and an electrically conducting member disposed in the third substrate and right under the part pad, the electrically conducting member electrically connecting the part pad and the circuit pattern of the second substrate.

In the substrate structure, the third substrate may have a hole formed right under the part pad;

an electrically conductive paste may form the electrically conducting member; and the electrically conductive paste may be filled with in the hole to electrically connect the part pad with the electric pattern of the second substrate.

In the substrate structure, the first to third substrates may comprise a resin material.

In the substrate, wherein all of the circuit pattern may be formed between the first and second substrates and between the second and third substrates. In the substrate, the second substrates may comprise:

a fourth substrate disposed on the first substrate;

a fifth substrate disposed on the fourth substrate; and a sixth substrate disposed on the fifth substrate.

In the structure, the third substrate may be disposed on the sixth substrate.

In the structure, the second circuit pattern may be formed between the third and sixth substrates and electrically connected with a battery.

A third circuit pattern may be formed between the first and fourth substrates and grounded.

DETAILED DESCRIPTION OF THE PRESENT INVENTION

Embodiments of the invention will be described with reference to the accompanying drawings.

Figure 1:
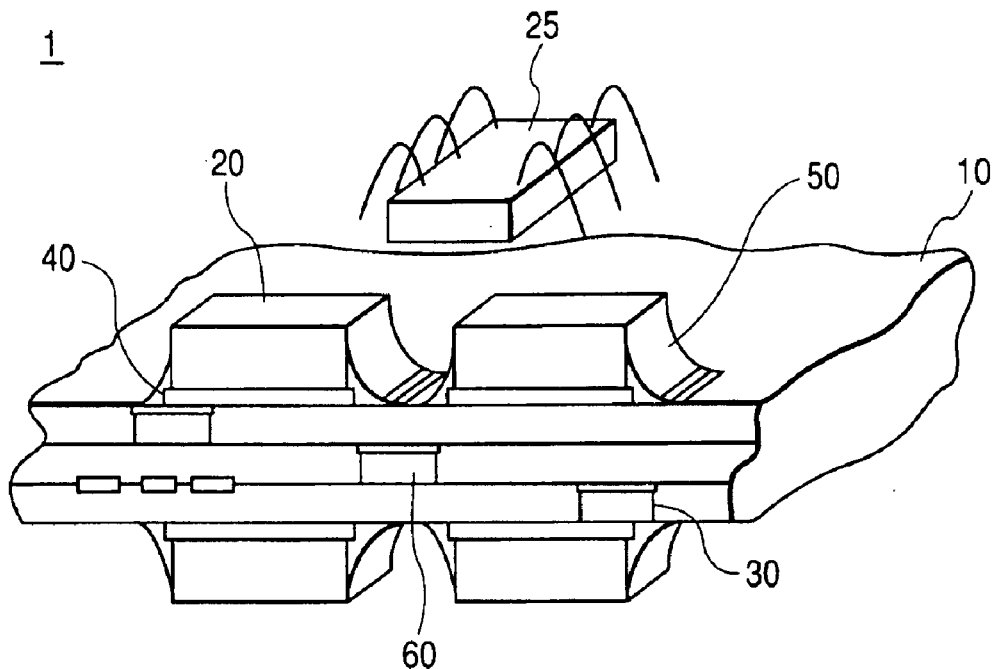
FIG. 1 is a view showing a substrate structure according to a first embodiment of the invention.

FIG. 1 is a view showing a substrate structure 1 according to a first embodiment of the invention.

The substrate structure 1 according to the first embodiment of the invention shows a substrate structure of a control substrate mounted at inside of a housing of a transmission in a vehicle for controlling the transmission.

A substrate 10 is formed by constituting multiple layers of plate members comprising a resin material having high heat resistance such as aramid material. The plate members is superposed on each other, According to the method of forming the substrate 10, the substrate is formed by forming a circuit pattern on the surface of the plate member comprising the aramid material and laminating other plate member to sandwich the formed pattern therebetween. Further, with regard to bonding of the plate members, bonding is carried out by melting a surface of a bonded portion of the members by heat. However, the bonding method is not limited thereto but the bonding can be carried out by various methods such as using an adhering agent.

The surface of the substrate 10 is formed with an electrically conductive part pad 40 and a mounted part 20 constituting a surface mounted part, is mounted on the part pad 40 and is mounted thereon. As a method of mounting the mounted part 20, there is provided a method of mounting the part by coating solder paste on a portion to which the mounted part 20 is intended to mount, mounting the mounted part 20 thereon and thereafter melting the solder paste by subjecting the substrate 10 under a high temperature environment such as a reflow furnace, or coating and solidifying electrically conductive paste to thereby mount the mounted part 20.

At a bottom portion of the part pad 40, that is, at an inner portion of the substrate 10, there is provided a through hole 30 for connecting the part pad 40 and a circuit pattern formed at an inner layer of the substrate 10 comprising the multiple layers. Further, the through hole 30 is provided also for connecting circuit patterns formed at different layers in the inner layer. Further, an electrically conductive portion 60 is formed at an inner portion of the through hole 30 in the form of filling the solder paste to thereby embed the through hole 30 and accordingly, there is constituted a shape strong at thermal stress in the vertical direction (thickness direction of substrate).

Further, the through hole 30 does not penetrate an upper face and a lower face of the substrate 10 as in a through hole but is provided basically for connecting contiguous layers in the substrate 10 and accordingly, a distance in the vertical direction (thickness of substrate) becomes shorter than that of a through hole. Therefore, thermal stress in the vertical direction operated to the through hole 30 becomes smaller than that of a through hole.

Further, since there is constructed the constitution of filling the inner portion of the through hole 30 by the solder paste and accordingly, the part pad 40 can be formed right above the through hole 30. Therefore, in comparison with the case of forming the through hole 30 at a portion different from the part pad 40, a mounting efficiency can significantly be promoted.

Further, according to the substrate structure 1 in the embodiment, all of circuit patterns are formed at the inner portion of the substrate 10 and the surface of the substrate 10 is only provided with the part pad 40 for mounting the mounted part 20 and accordingly, arrangement of the part pad 40 formed at the surface portion of the substrate 10 can be simplified to a degree of eliminating the possibility of shortcircuiting circuits by dew condensation or the like. Therefore, the resist film for covering the part pad 40 or the like can be dispensed with and accordingly, break of the circuit pattern accompanied by break of the resist film under the high temperature environment can be prevented.

Figure 2:
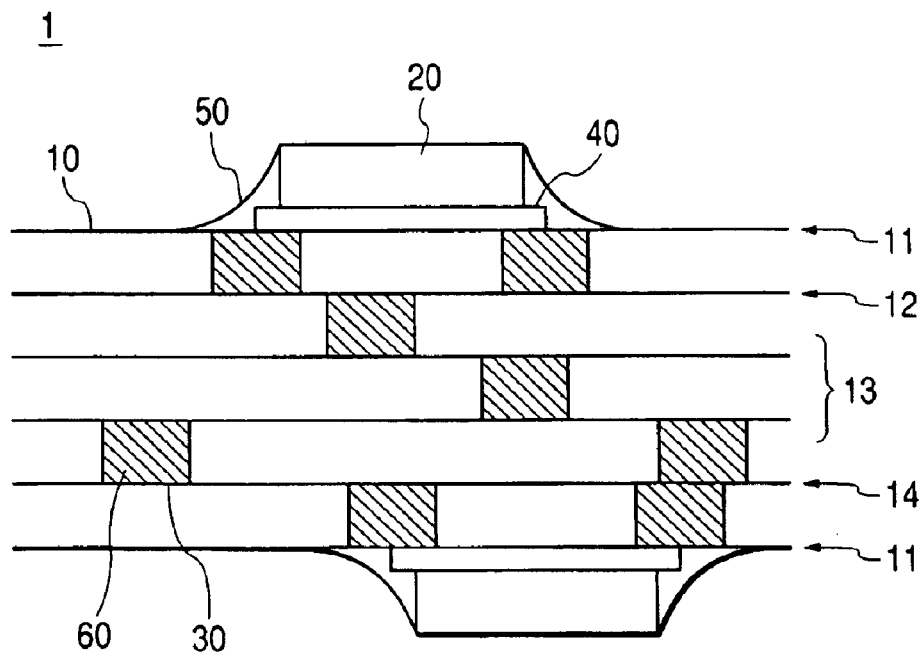
FIG. 2 is a view showing details of a section of the substrate according to the first embodiment of the invention.
Figure 3:
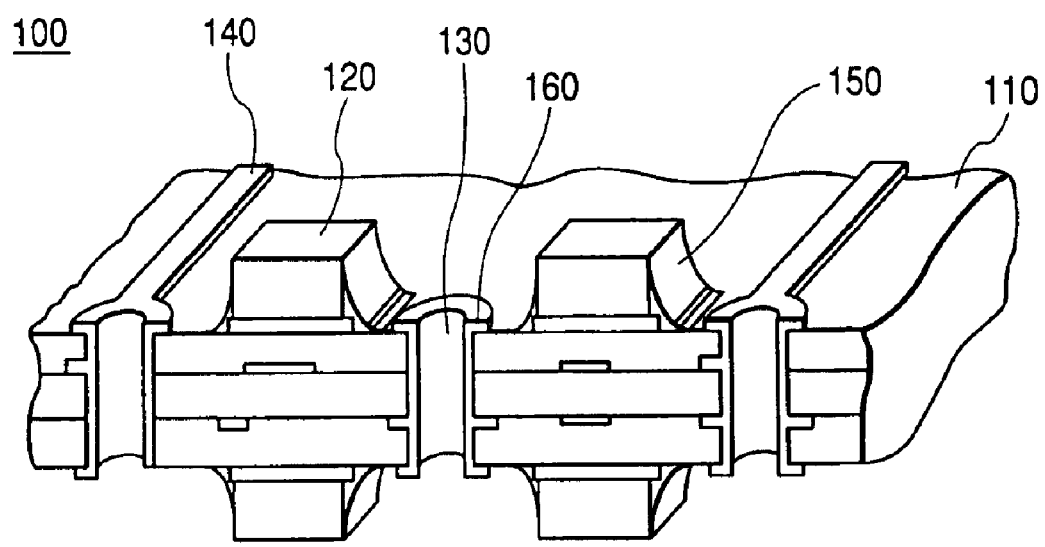
FIG. 3 is a view showing a conventional substrate structure.

FIG. 2 is a view showing details of a section of the substrate according to the first embodiment of the invention.

The substrate structure 1 shown in FIG. 2 shows the section of the substrate 10 when 6 of layers are provided.

Among layers provided at the substrate 10, surface layers 11 exposed to respective surfaces of upper and lower faces of the substrate, are constructed by a constitution in which only the part pads 40 are formed and by a constitution in which the part pads 40 are not exposed to the surfaces by mounting the mounted parts 20 thereon by solder 50. Further, the layers at the inner portion of the substrate contiguous to the surface layers 11, are a power source layer 12 and a surround layer 14, the power source layer 12 is connected to a power source and the ground layer 14 is grounded. The other layers sandwiched by the power source layer 12 and the ground layer 14, are circuit layers 13 which are layers for arbitrarily connecting the mounted parts 20 mounted on the surfaces of the substrate 10 with the power source layer 12 and the ground layer 14 and forming circuit patterns. Further, intervals between the respective layers of the substrate 10 are electrically connected by the through holes 30.

By sandwiching the circuit layers 13 in the substrate 10 by the power source layer 12 and the ground layer 14 in this way, noise mixed from outside to the circuit layers 13 can be cut by the power source layer 12 and the ground layer 14.

Next, a description will be given of effects produced by forming the substrate 10 by the aramid material.

The high temperature resistance of the aramid material used in the substrate 10 falls in a range of 170 through 180° C. and accordingly, the aramid material is not softened even when provided at inside of a housing of a transmission (surrounding temperature is about 120° C.).

The linear expansion coefficient produced by heat of the substrate 10 becomes about 8 ppm in the horizontal direction (longitudinal direction of substrate) by forming the substrate 10 by the aramid material and accordingly, thermal stress produced in the horizontal direction becomes significantly lower than that of the substrate formed by the glass epoxy material. Further, since the thermal stress in the horizontal direction is lowered, a bare chip part 25 having an electrode at outside of the chip can be mounted to the substrate 10 as the mounted part 20.

Further, the aramid material is more excellent than the glass epoxy material in view of its strength and therefore, when 1.6 mm is needed for the thickness of the substrate 10, for example, in the case of forming the substrate 10 by the glass epoxy material, the thickness can be restrained to 0.6 through 0.8 mm in the case of the aramid material.

Further, the aramid material is provided with a characteristic of low dielectric constant and therefore, by using the aramid material for the substrate 10, there is produced an effect of absorbing noise generated among the respective layers of the substrate 10.

According to the substrate structure 1 in the first embodiment of the invention described above, it has been confirmed by experiments that the substrate structure 1 functions normally even when the substrate structure 1 is subjected to thermal cycle of 3000 cycles between −40° C. and 125° C. of surrounding temperature, or even when subjected under an environment at surrounding temperature 130° C. for 2000 hours.

Therefore, the substrate structure 1 according to the first embodiment of the invention is regarded to function normally even under a high temperature environment as in a housing of a transmission in a vehicle (surrounding temperature is about 120° C.).

Further, although according to the embodiment, a description has been given by assuming the case of mounting the substrate structure 1 in the housing of the transmission of the vehicle, naturally, the substrate structure 1 is applicable to high temperature environment and applicable even to a case in which a surrounding environment is not under a high temperature environment.

Further, although according to the embodiment, the aramid material is used as the material of the substrate 10, as the material, any material may be used so far as the material is provided with high temperature resistance under a temperature environment of mounting the substrate.

Further, although according to embodiment, a description has been given of the case in which the substrate 10 comprises the 6 layers, the invention is not limited thereto.

Further, although according to embodiment, in order to provide resistance against thermal stress in the vertical direction of the through hole 30, the solder paste is filled at the inner portion of the through hole 30, further, the through hole 30 is provided such that contiguous layers are connected to each other, and the aramid material is used as the material of the substrate 10, the invention does not need to necessarily take all of these into a consideration but when sufficient resistance against thermal stress in the vertical direction under the temperature environment of mounting the substrate is achieved by carrying out at least one of these, there may be constructed a constitution taking only one of these into a consideration.

As has been explained above, according to the substrate structure in the invention, there is constructed the constitution in which the substrate is formed by the resin material or the like having high temperature resistance and the resist film may not be provided on the surface of the substrate and constructed by the constitution of restraining thermal stress in the vertical direction of the substrate (thickness direction of substrate) and accordingly, the substrate structure capable of being mounted under the high temperature environment, can be provided at low cost.

What is claimed is:

1. A substrate structure for an electrical device, comprising:
    a plurality of substrates superposed on each other, the plurality of substrates being a plurality of resin substrates;
    a circuit pattern disposed entirely between the plurality of substrates;
    an electrical part mounted on the uppermost substrate, the electrical part having an electrode;
    a part pad provided on the uppermost substrate to correspond to the electrode of the electrical part, the part pad not exposed to outside of the substrate structure; and
    an electrically conducting member disposed in the uppermost substrate and right under the part pad, the electrically conducting member electrically connecting the part pad with the circuit pattern.

2. The substrate structure according to claim 1, wherein the substrate has a hole formed right under the part pad;
    an electrically conductive paste forms the electrically conducting member; and
    the electrically conductive paste is filled with in the hole to electrically connect the part pad with the circuit pattern.

3. The substrate structure according to claim 1, wherein the circuit pattern comprises at least one circuit pattern; and
    all of the at least one circuit pattern is formed between the plurality of substrates.

4. The substrate structure according to claim 3, wherein the circuit pattern comprises a plurality of circuit patterns; and
    the uppermost circuit pattern is electrically connected with a battery; and
    the lowermost circuit pattern is grounded.

5. A substrate structure for an electrical device, comprising:
    a plurality of substrates superposed on each other, the plurality of substrates being a plurality of resin substrates;
    a plurality of circuit patterns provided at inner substrates all disposed between two other substrates of the plurality of substrates;
    an electrical part mounted on the uppermost substrate, the electrical part having an electrode;
    a part pad provided on the uppermost substrate to correspond to the electrode of the electrical part, the part pad not exposed to outside of the substrate structure; and
    an electrically conducting member disposed in the uppermost substrate and right under the part pad, the electrically conducting member electrically connecting the part pad and a circuit pattern.

6. The substrate structure as claimed in claim 5, wherein the uppermost circuit pattern is electrically connected with a battery; and the lowermost circuit pattern is grounded.

7. A substrate structure having two faces for an electrical device, comprising:
    a plurality of substrates superposed on each other, the plurality of substrates being a plurality of resin substrates;
    a circuit pattern disposed entirely between the plurality of substrates;
    part pads provided on both faces; and
    an electrically conducting member disposed in the uppermost substrate and under each part pad, each electrically conducting member electrically connecting the respective part pad with the circuit pattern, wherein when each of part pads is connected to an electrical part, a surface of each of part pads is covered with the electrical part and solder so that each of part pads is not exposed to the outside of the substrate structure.

8. A substrate structure for an electrical device, comprising:
- a plurality of substrates superposed on each other, the plurality of substrates being a plurality of resin substrates;
- a plurality of circuit patterns provided at inner substrates all disposed between two other substrates of the plurality of substrates;
- a part pad provided on the uppermost substrate; and
- an electrically conducting member disposed in the uppermost substrate and right under the part pad, the electrically conducting member electrically connecting the part pad and a circuit pattern, wherein when the part pad is connected to an electrical part, a surface of the part pad is covered with the electrical part and solder so that the part pad is not exposed to the outside of the substrate structure.

9. The substrate structure according to claim 1, wherein a surface of the part pad is covered with at least one of the part and solder so that the part pad is not exposed to the outside of the substrate structure.

10. The substrate structure according to claim 5, wherein a surface of the part pad is covered with at least one of the part and solder so that the part pad is not exposed to the outside of the substrate structure.

* * * * *